United States Patent [19]

Berger et al.

[11] Patent Number: 4,463,407
[45] Date of Patent: Jul. 31, 1984

[54] SURFACE MOUNTED ELECTRONIC COMPONENTS HAVING PRE-APPLIED SOLDER

[75] Inventors: Jean P. Berger, Stittsville; Carlyle W. Crothers, Kinburn, both of Canada

[73] Assignee: Northern Telecom Limited, Montreal, Canada

[21] Appl. No.: 424,088

[22] Filed: Sep. 27, 1982

[51] Int. Cl.³ .............................................. H01G 1/14
[52] U.S. Cl. .................................................. 361/306
[58] Field of Search ..................... 339/278; 338/322; 361/306, 308, 309, 310

[56] References Cited

U.S. PATENT DOCUMENTS

| | | | |
|---|---|---|---|
| 2,850,681 | 9/1958 | Horton | 361/306 X |
| 3,237,286 | 3/1966 | Ebling et al. | 338/322 X |
| 3,515,958 | 6/1970 | Claypoole et al. | 361/310 |
| 3,550,228 | 12/1970 | Asscher | 361/306 X |
| 3,612,963 | 10/1971 | Piper et al. | 361/309 X |
| 3,683,245 | 8/1972 | Bacher et al. | 361/306 X |
| 3,766,451 | 10/1973 | Voda et al. | 338/322 X |

*Primary Examiner*—Donald A. Griffin
*Attorney, Agent, or Firm*—Sidney T. Jelly

[57] ABSTRACT

A surface mounting electronic component is provided with a layer of solder attached to each end of the component. Preferably the solder is flux cored. By this means deposition of solder paste on printed circuit boards and similar members is avoided, and high quality solder joints obtained.

2 Claims, 2 Drawing Figures

SURFACE MOUNTED ELECTRONIC COMPONENTS HAVING PRE-APPLIED SOLDER

This invention relates to surface mounted electronic components, which are normally soldered to printed circuit boards (PCBs). In particular such components are normally of ceramic substrate structures with tin/lead coated ends.

The use of surface mounted components complicates assembly of PCB's as many other components having leads are also required on a board. Usually surface mounted components are mounted on the opposite side of the PCB to that of leaded components—this because the leaded components are on the side of the PCB remote from the circuit pattern, the leads extending through the board and soldered to the circuit pattern.

The leaded components are first inserted and the leads must be cut and crimped or clinched to prevent these components from falling off when the board is inverted to mount the surface mounted components. The presents of the clinched ends of the leads prevents application of solder paste through a screen or stencil as these must be in close contact with the board surface for efficient application and correct positioning of the solder paste. Therefore wave soldering is required. This necessitates attaching the surface mounted components to the board first by adhesive, so that the board can be turned over for wave soldering.

Wave soldering is not fully satisfactory as the prefluxing of the board, and components, prior to soldering results in flux remaining in the small clearances between components and board. Such flux is very difficult and often impossible to remove. Also the quality of solder joints is often poor, particularly for surface mounted components.

The present invention provides for surface mounted components having ends prepared, during mass production, with a layer of solder preferably flux cored. With such components, leaded components can first be wave soldered. As no components are mounted on the circuit pattern side of the board at that time, cleaning is easy. The surface mounted components are then positioned on the circuit pattern and soldered by heating. The solder applied to the surface mounted components is chosen to have a melting point below that of the solder used in the wave soldering.

The invention will be readily understood by the following description in conjunction with the accompanying drawings, in which.

Figure 1:
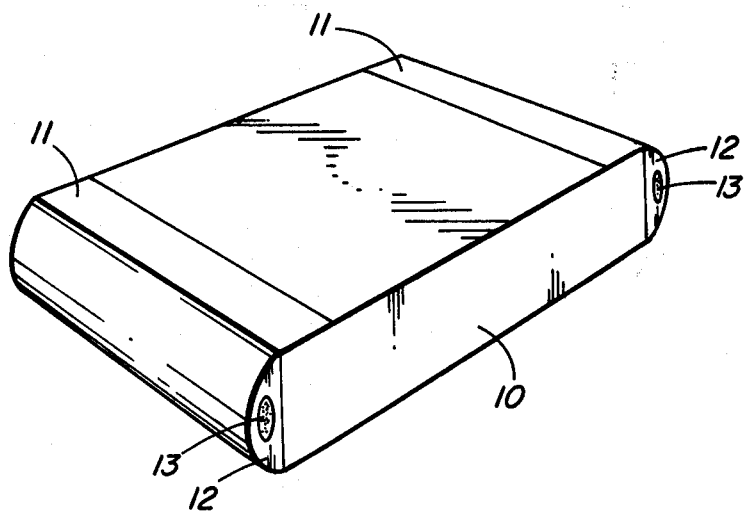
FIG. 1 is a perspective view of a component with pre soldered ends.

In FIG. 1 a typical form of surface mounted component 10 is illustrated. Normally the component is of ceramic as a substrate, with, for example, a resistor or capacitor formed on a top surface. This is not shown in FIG. 1. The ends are coated, at 11, to provide contact areas, with, for example a tin/lead alloy. On each end is sonically welded a length of flux cored solder 12, the flux indicated at 13.

The components 10 are made in large units, for example on ceramic substrates 4 inches square. This is illustrated diagrammatically in FIG. 2. The components are formed in a conventional manner, by the deposition or formation of the layer or layers of suitably conductive material, to make undivided devices, i.e. resistors or capacitors, for example. The ceramic substrate is then slit along the lines 14 and 15. First the substrate is slit along the lines 14 to provide strips of components. The tin/lead or other contact coating 11 is applied on the ends. The strips are then fed through an apparatus and a strip of preformed solder, preferably flux cored, fed along against each long edge, the solder attached to the edges, as by sonic welding. The strips are then slit, along lines 15, to give individual components, each with solder on each end surface.

The use of such pre-soldered components avoids constraints on orientation and density of components, during circuit layout. The quality of solder joints will be high and trapping of flux beneath components is avoided. The components are merely positioned on the board and heated to cause the solder 12 to flow and form a joint.

Figure 2:
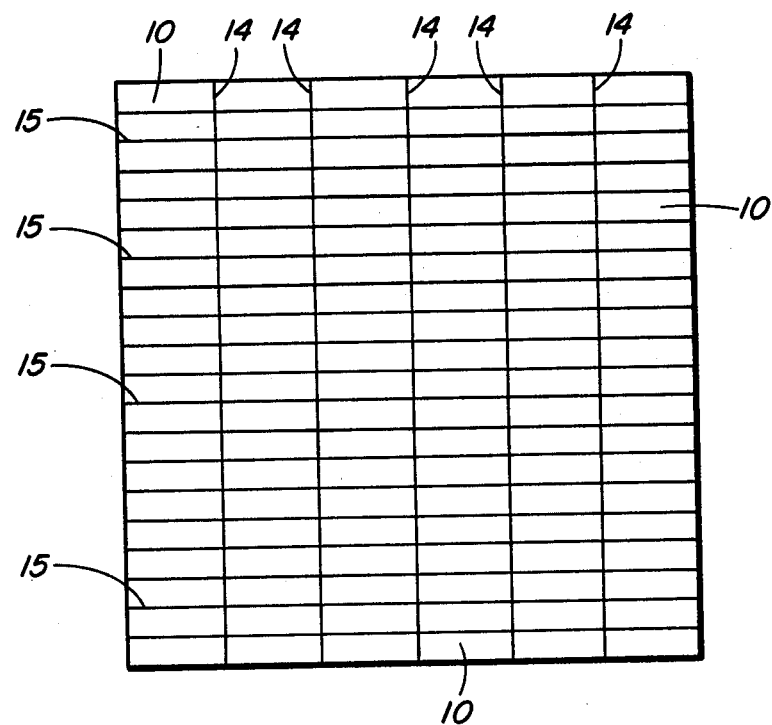
FIG. 2 is a plan view of a plurality of components in the form in which they are manufactured, prior to slitting into individual components.

It will be appreciated that the component illustrated in FIG. 1 is very much enlarged and even in FIG. 2 the components are still many times larger than actual components.

What is claimed is:

1. A surface mounting electronic component for mounting on a printed circuit board, said component of rectangular form and having opposite ends coated with a metal to provide a solderable contact area at each end, and a preformed layer of flux cored solder attached on the end surface at said opposite ends.

2. A component as claimed in claim 1, the solder attached by sonic welding.

* * * * *